US012782986B2

(12) United States Patent
Sabut et al.

(10) Patent No.: US 12,782,986 B2
(45) Date of Patent: Nov. 3, 2026

(54) LOW FLICKER NOISE DIFFERENTIAL VOLTAGE REFERENCE GENERATOR CIRCUIT

(71) Applicant: STMicroelectronics International N.V., Geneva (CH)

(72) Inventors: Marc Sabut, Eybens (FR); Emmanuel Allier, Grenoble (FR); Matthieu Desvergne, Claix (FR)

(73) Assignee: STMicroelectronics International N.V., Geneva (CH)

( * ) Notice: Subject to any disclaimer, the term of this patent is extended or adjusted under 35 U.S.C. 154(b) by 159 days.

(21) Appl. No.: 18/897,333

(22) Filed: Sep. 26, 2024

(65) Prior Publication Data

US 2025/0103082 A1 Mar. 27, 2025

Related U.S. Application Data

(63) Continuation-in-part of application No. 18/373,520, filed on Sep. 27, 2023.

(51) Int. Cl.

*G05F 3/30* (2006.01)
*G05F 1/46* (2006.01)
*G05F 1/575* (2006.01)
*H03F 3/45* (2006.01)

(52) U.S. Cl.

CPC .............. *G05F 1/468* (2013.01); *G05F 1/575* (2013.01); *G05F 3/30* (2013.01); *H03F 3/45183* (2013.01); *H03F 3/45273* (2013.01)

(58) Field of Classification Search

CPC ........................................................ G05F 3/30
See application file for complete search history.

(56) References Cited

U.S. PATENT DOCUMENTS 6,285,244 B1 9/2001 Goldberg
10,983,547 B1 4/2021 Ivanov
(Continued)

OTHER PUBLICATIONS

Brown et al. "Comparison of Operational Transconductance Amplifiers. " Georgia Tech, May 16, 2011, Internet Archive Wayback Machine, https://web.archive.org/web/20110516223604/http://users.ece.gatech.edu/~lanterma/studentprojects/TeamOTAComparison.pdf. Accessed Sep. 17, 2025. (Year: 2011).*
(Continued)

*Primary Examiner* — Gary L Laxton
*Assistant Examiner* — Jennifer C Caulk
(74) *Attorney, Agent, or Firm* — Crowe & Dunlevy LLC

(57) ABSTRACT

A bandgap voltage generator circuit is formed using only bipolar transistors. The bandgap voltage generator circuit includes output nodes generating first and second bandgap reference currents. A transconductance amplifier circuit in a current control feedback loop of the bandgap voltage generator circuit has differential inputs which receive base currents. A differential amplifier circuit has inputs configured to receive the first and second bandgap reference currents and includes a compensation current sink circuit configured to sink compensation currents from the first and second bandgap reference currents which correspond to the base current received at the differential inputs of the transconductance amplifier circuit.

23 Claims, 4 Drawing Sheets

(56) References Cited

U.S. PATENT DOCUMENTS

| | | | | |
|---|---|---|---|---|
| 2002/0158682 | A1* | 10/2002 | Conte | G05F 3/30 327/539 |
| 2005/0038969 | A1 | 2/2005 | Schrodinger et al. | |
| 2005/0231270 | A1* | 10/2005 | Washburn | G05F 3/30 327/539 |
| 2008/0224759 | A1 | 9/2008 | Marinca | |
| 2010/0295529 | A1 | 11/2010 | Consoer | |
| 2014/0254202 | A1 | 9/2014 | Balakrishnan et al. | |
| 2016/0266598 | A1* | 9/2016 | Wong | G05F 3/267 |
| 2022/0050488 | A1* | 2/2022 | Randlisek | G05F 3/30 |
| 2022/0109413 | A1* | 4/2022 | Danyuk | H03F 3/45304 |
| 2022/0374037 | A1 | 11/2022 | Motz et al. | |
| 2024/0168507 | A1* | 5/2024 | Krishnan | G05F 3/265 |

OTHER PUBLICATIONS

Brown, Paul, et al.: "Comparison of Operational Transconductance Amplifiers," Georgia Tech, May 16, 2011, 15 pgs.

Nagulapalli R., et al.: "A Single BJT 10.2 ppm/° C. Bandgap Reference in 45nm CMOS Technology," Oxford Brookes University, UK, Oct. 27, 2020, 4 pgs.

* cited by examiner

LOW FLICKER NOISE DIFFERENTIAL VOLTAGE REFERENCE GENERATOR CIRCUIT

CROSS REFERENCE TO RELATED APPLICATIONS

This application is a Continuation-In-Part (CIP) of U.S. patent application Ser. No. 18/373,520, filed Sep. 27, 2023, the disclosure of which is incorporated herein by reference.

TECHNICAL FIELD

The present disclosure generally relates to differential voltage reference generator circuits and, in particular, to a differential voltage reference generator with low flicker noise.

BACKGROUND

Reference is made to FIGS. 1A and 1B which show a circuit diagram for a conventional current-mode bandgap reference voltage generator circuit 10. The circuit 10 includes a current mirroring circuit 12 and bandgap core circuit 14.

The current mirroring circuit 12 is formed by p-channel metal oxide semiconductor field effect transistor (MOSFET) devices M1, M2 and M3. The source terminals of transistors M1, M2 and M3 are coupled, preferably connected, to the supply node Vdd. The gate terminals of transistors M1, M2 and M3 are coupled, preferably connected, to each other and biased by a voltage Vout to generate mirrored currents. The drain terminal of transistor M1 outputs a first mirrored current, the drain terminal of transistor M2 outputs a second mirrored current, and the drain terminal of transistor M3 outputs a third mirrored current. The third mirrored current output from the drain terminal of transistor M3 is applied across resistor R3 to generate the bandgap reference voltage Vbg at an output node of the circuit 10. Resistor R3 has a first terminal coupled, preferably connected, to the drain of transistor M3 at the output node and a second terminal coupled, preferably connected, to the ground node Gnd.

The bandgap core circuit 14 includes a differential amplifier circuit 16, for example comprising an operational amplifier (OP-AMP), configured in a current control feedback loop that generates the bias voltage Vout which controls generation of the mirrored currents by the transistors M1, M2 and M3. The non-inverting (+) input of the differential amplifier circuit 16 receives a voltage V+ at the drain of the transistor M1 and the inverting (−) input of the differential amplifier circuit 16 receives a voltage V− at the drain of the transistor M2. The bandgap core circuit 14 further includes PNP bipolar transistors Q1 and Q2. The collector terminals of transistors Q1 and Q2 are coupled, preferably connected, to the ground node Gnd. The base terminals of transistors Q1 and Q2 are coupled, preferably connected, to each other and to the ground node Gnd. The transistors Q1 and Q2 of the bandgap core circuit 14 are thus each connected in diode-configuration. The emitter terminal of transistor Q1 is coupled, preferably connected, to an intermediate node 18. The emitter terminal of transistor Q2 is coupled, preferably connected, to the drain of transistor M2 at the inverting (−) input of the differential amplifier circuit 16. A resistor R1 has a first terminal coupled, preferably connected, to the intermediate node 18 and a second terminal coupled, preferably connected, to the drain of transistor M1 at the non-inverting (+) input of the differential amplifier circuit 16. A first resistor R2 has a first terminal coupled, preferably connected, to the drain of transistor M1 at the non-inverting (+) input of the differential amplifier circuit 16 and a second terminal coupled, preferably connected, to the ground node Gnd. A second resistor R2 has a first terminal coupled, preferably connected, to the emitter of transistor Q2 at the inverting (−) input of the differential amplifier circuit 16 and a second terminal coupled, preferably connected, to the ground node Gnd.

As an example, the differential amplifier circuit 16 includes a differential pair 20 of input transistors M5, M6 coupled to a current mirror load circuit 22 formed by transistors M7, M8. The input transistors M5, M6 are n-channel MOSFETs. The load transistors M7, M8 are p-channel MOSFETs. The common source terminals of the transistors M5 and M6 are coupled, preferably connected, to a tail current source 20 connected to the ground node Gnd. The gate terminal of input transistor M5 (at the non-inverting (+) input) receives the voltage V+ at the drain of the transistor M1 and the gate terminal of the input transistor M6 (at the inverting (−) input) receives the voltage V− at the drain of the transistor M2. The drain terminal of input transistor M5 is coupled, preferably connected, to the drain and gate terminals of the load transistor M7. The drain terminal of input transistor M6 is coupled, preferably connected, to the drain terminal of the load transistor M8 at the output of the amplifier. The gate terminals of the transistors M7, M8 are coupled, preferably connected, to each other. The transistor M7 is connected in diode-configuration. The output voltage Vout of the differential amplifier circuit 16 is generated at the common drain terminals of transistors M6, M8 and is a function of the difference between the voltages V+ and V−, and the magnitudes of the first, second and third mirrored currents at the drains of transistors M1, M2 and M3 is a function of the voltage Vout.

The principle of operation of the circuit 10 is to generate a complementary to absolute temperature (CTAT) voltage and a proportional to absolute temperature (PTAT) voltage, and then add those voltages in a scaled proportion to achieve a cancelation of the positive and negative temperature coefficients.

The generating of the PTAT component uses the difference in base to emitter voltages ($V_{BE}$) between two forward bias voltages having different current densities (m) using transistors Q1 and Q2. The voltage across resistor R1 is then PTAT in nature:

$$I_{ptat} = \frac{V_T \ln m}{R1}$$

The current flowing through the resistor R2 is CTAT:

$$I_{ctat} = \frac{V_{BE}}{R2}$$

The output bandgap voltage Vbg can be expressed as follows:

$$Vbg = \frac{R3}{R2}\left(V_{BE} + \frac{R2}{R1} V_T \ln m\right)$$

The operating point of the circuit 10 can accordingly be scaled by setting of the resistances for resistors R2 and R3, and the temperature coefficient can be adjusted by setting of the resistances for resistors R1 and R2.

There is a recognized problem with the circuit 10. The MOSFETs M5, M6, M7 and M8 introduce flicker (1/f) noise which can perturb the output voltage Vbg. This is a concern when the output voltage Vbg provides a reference voltage for a noise sensitive circuit (like an analog-to-digital converter (ADC)).

To address the issue of flicker noise, there is a teaching in the art to use a chopper technique. See, for example, U.S. Patent Application Publication No. 2010/0295529 and U.S. Pat. No. 10,983,547 (both incorporated herein by reference). However, there are a number of drawbacks associated with the use of the chopper technique including the need for more complicated circuitry and a stable (for example, external) clock source to control the switching operations.

SUMMARY

In an embodiment, a circuit comprises: a bandgap voltage generator circuit formed using only bipolar transistors and including a transconductance amplifier circuit in a current control feedback loop having a differential input which receives a bipolar transistor base current, wherein the bandgap voltage generator circuit includes a first output node generating a first current comprising a bandgap reference current plus the bipolar transistor base current and a second output node generating a second current comprising the bandgap reference current minus the bipolar transistor base current; and a transresistance amplifier circuit comprising: a differential amplification circuit having a non-inverting input configured to receive the first current, an inverting input configured to receive the second current, a non-inverting output and an inverting output; a first feedback resistor coupled between the non-inverting input and the inverting output; a second feedback resistor coupled between the inverting input and the non-inverting output; and a compensation current sink circuit configured to sink a first compensation current from the non-inverting input corresponding to the base current and configured to sink a second compensation current from the inverting input corresponding to the base current.

In an embodiment, a circuit comprises: a first current mirroring circuit including a first bipolar transistor, a second bipolar transistor, a third bipolar transistor and a fourth bipolar transistor, wherein a first current is output by the third bipolar transistor and a second current is output by the fourth bipolar transistor; a second current mirroring circuit configured to mirror the second current and generate a third current; a bandgap core circuit including: a fifth bipolar transistor and sixth bipolar transistor coupled, respectively, to the first and second bipolar transistors and configured to use a difference in base to emitter voltages of the fifth and sixth bipolar transistors to generate a complementary to absolute temperature (CTAT) voltage and a proportional to absolute temperature (PTAT) voltage from currents output by the first and second bipolar transistors; and a transconductance amplification circuit having a differential input comprising seventh and eighth bipolar transistors coupled, respectively, to the first and second bipolar transistors, the seventh bipolar transistor having a base configured to receive a first base current and the eighth bipolar transistor having a base configured to receive a second base current, and an output coupled to apply a bias current to base terminals of the first, second, third and fourth bipolar transistors; and a differential amplification circuit having a non-inverting input configured to receive the first current, an inverting input configured to receive the third current, a ninth bipolar transistor having a base coupled to the non-inverting input and configured to sink a first compensation current corresponding to the first base current and a tenth bipolar transistor having a base coupled to the inverting input and configured to sink a second compensation current corresponding to the second base current.

BRIEF DESCRIPTION OF THE DRAWINGS

For a better understanding of the embodiments, reference will now be made by way of example only to the accompanying figures in which.

DETAILED DESCRIPTION

Like features have been designated by like references in the various figures. In particular, the structural and/or functional features that are common among the various embodiments may have the same references and may dispose identical structural, dimensional and material properties.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms “front”, “rear”, “top”, “bottom”, “left”, “right”, etc., or relative positions, such as terms “above”, “under”, “upper”, “lower”, etc., or to terms qualifying directions, such as terms “horizontal”, “vertical”, etc., unless specified otherwise, it is referred to the orientation of the drawings.

Figure 2A:
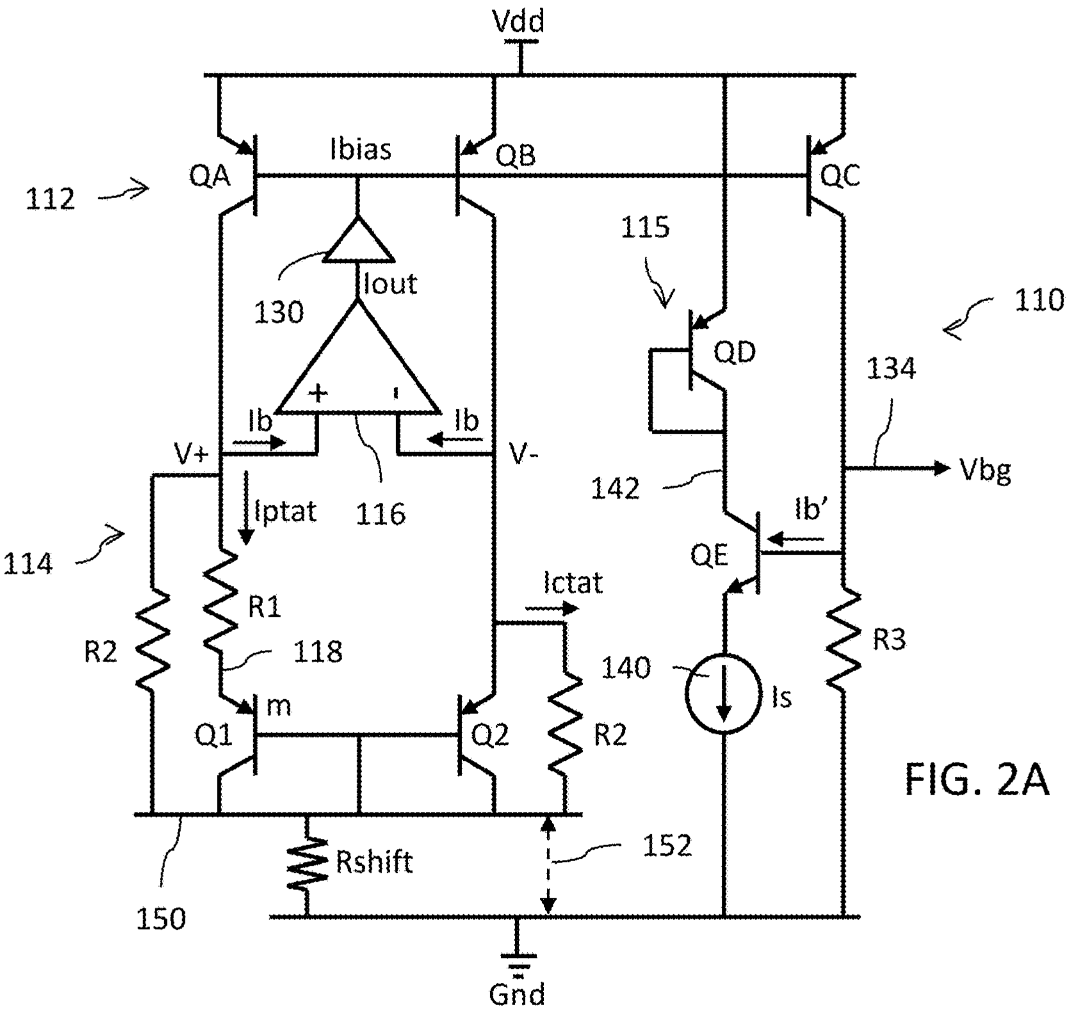
FIGS. 2A and 2B show a circuit diagram for a flicker noise free current-mode bandgap reference voltage generator circuit.
Figure 2B:
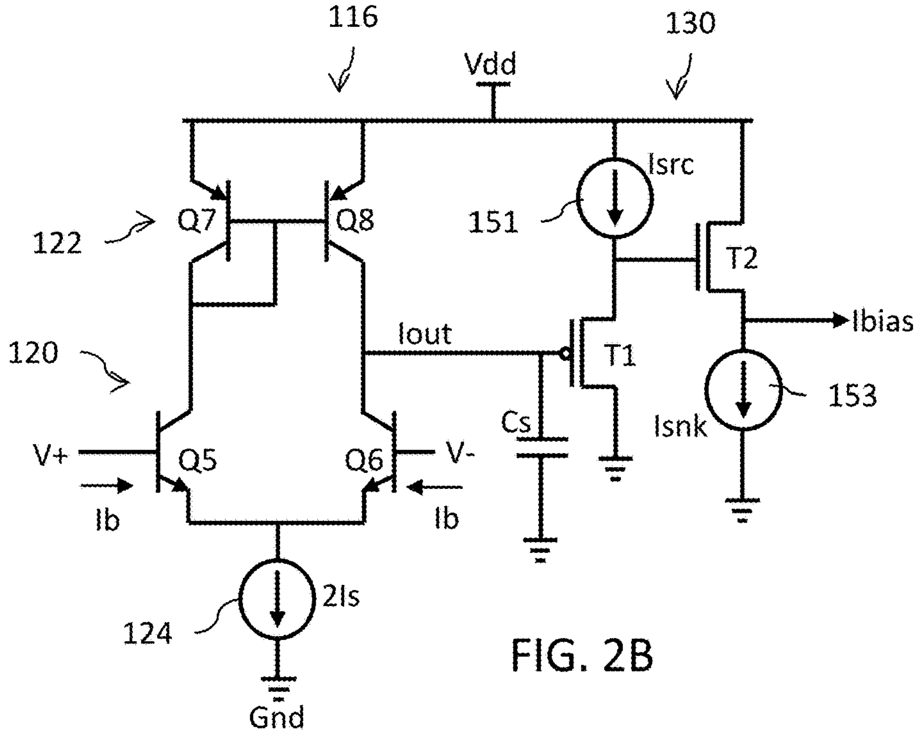

Reference is now made to FIGS. 2A and 2B which show a circuit diagram for a flicker noise free current-mode bandgap reference voltage generator circuit 110. The circuit 110 includes a current mirror circuit 112, a bandgap core circuit 114 and a compensation current sink circuit 115.

The current mirror circuit 112 is formed by PNP bipolar transistors QA, QB and QC. The emitter terminals of transistors QA, QB and QC are coupled, preferably connected, to the supply node Vdd. The base terminals of transistors QA, QB and QC are coupled, preferably connected, to each other and biased by a bias current Ibias to generate mirrored currents. The collector terminal of transistor QA outputs a first mirrored current, the collector terminal of transistor QB outputs a second mirrored current, and the collector terminal of transistor QC outputs a third mirrored current. The third mirrored current output from the collector terminal of transistor QC is applied across resistor R3 to generate the bandgap reference voltage Vbg at an output node 134 of the circuit 110. Resistor R3 has a first terminal coupled, preferably connected, to the collector of transistor QC at the output node 134 and a second terminal coupled, preferably connected, to the ground node Gnd.

The bandgap core circuit 114 includes a differential operational transconductance amplifier (OTA) circuit 116 configured in a current control feedback loop that generates an output current Iout which controls generation of the mirrored currents by the transistors QA, QB and QC. The non-inverting (+) input of the differential OTA circuit 116 receives a voltage V+ at the collector of the transistor QA and the inverting (−) input of the differential OTA circuit 116 receives a voltage V− at the collector of the transistor QB. The bandgap core circuit 114 further includes PNP bipolar transistors Q1 and Q2. The collector terminals of transistors Q1 and Q2 are coupled, preferably connected, to a virtual ground node 150. The base terminals of transistors Q1 and Q2 are coupled, preferably connected, to each other and to the virtual ground node 150. The transistors Q1 and Q2 of the bandgap core circuit 114 are thus each connected in diode-configuration. The emitter terminal of transistor Q1 is coupled, preferably connected, to an intermediate node 118. The emitter terminal of transistor Q2 is coupled, preferably connected, to the collector of transistor QB at the inverting (−) input of the differential OTA circuit 116. A resistor R1 has a first terminal coupled, preferably connected, to the intermediate node 18 and a second terminal coupled, preferably connected, to the collector of transistor QA at the non-inverting (+) input of the differential OTA circuit 116. A first resistor R2 has a first terminal coupled, preferably connected, to the collector of transistor QA at the non-inverting (+) input of the differential OTA circuit 116 and a second terminal coupled, preferably connected, to the virtual ground node 150. A second resistor R2 has a first terminal coupled, preferably connected, to the emitter of transistor Q2 at the inverting (−) input of the differential OTA circuit 116 and a second terminal coupled, preferably connected, to the virtual ground node 150.

A resistor Rshift has a first terminal coupled, preferably connected, to the virtual ground node 150 and a second terminal coupled, preferably connected, to a circuit ground node Gnd. It will be noted that in an alternative implementation, the resistor Rshift may be omitted and the virtual ground node 150 and ground node Gnd would then be the same node. This alternative implementation is indicated in FIG. 2A by the dotted double-arrow connection 152.

The differential OTA circuit 116 includes a differential pair 120 of input transistors Q5, Q6 coupled to a current mirror load circuit 122 formed by transistors Q7, Q8. The input transistors Q5, Q6 are NPN bipolar transistors. The load transistors Q7, Q8 are PNP bipolar transistors. The common emitter terminals of the transistors Q5 and Q6 are coupled, preferably connected, to a tail current source 124 connected to the ground node Gnd. The base terminal of input transistor Q5 (at the non-inverting (+) input) receives the voltage V+ at collector of the transistor QA (as well as a base current Ib) and the base terminal of the input transistor Q6 (at the inverting (−) input) receives the voltage V− at collector of the transistor QB (as well as a base current Ib). The collector terminal of input transistor Q5 is coupled, preferably connected, to the collector and base terminals of the load transistor Q7. The collector terminal of input transistor Q6 is coupled, preferably connected, to the collector terminal of the load transistor Q8 at the output of the amplifier. The base terminals of the transistors Q7, Q8 are coupled, preferably connected, to each other. The transistor Q7 is connected in diode-configuration. The output current Iout of the differential OTA circuit 116 generated at the common collector terminals of transistors Q6 and Q8 is a function of the difference between the voltages V+ and V−. A stabilization capacitor Cs has a first terminal coupled, preferably connected, to the common collector terminals of transistors Q6 and Q8 and a second terminal coupled, preferably connected, to the ground node Gnd.

Figure 1A:
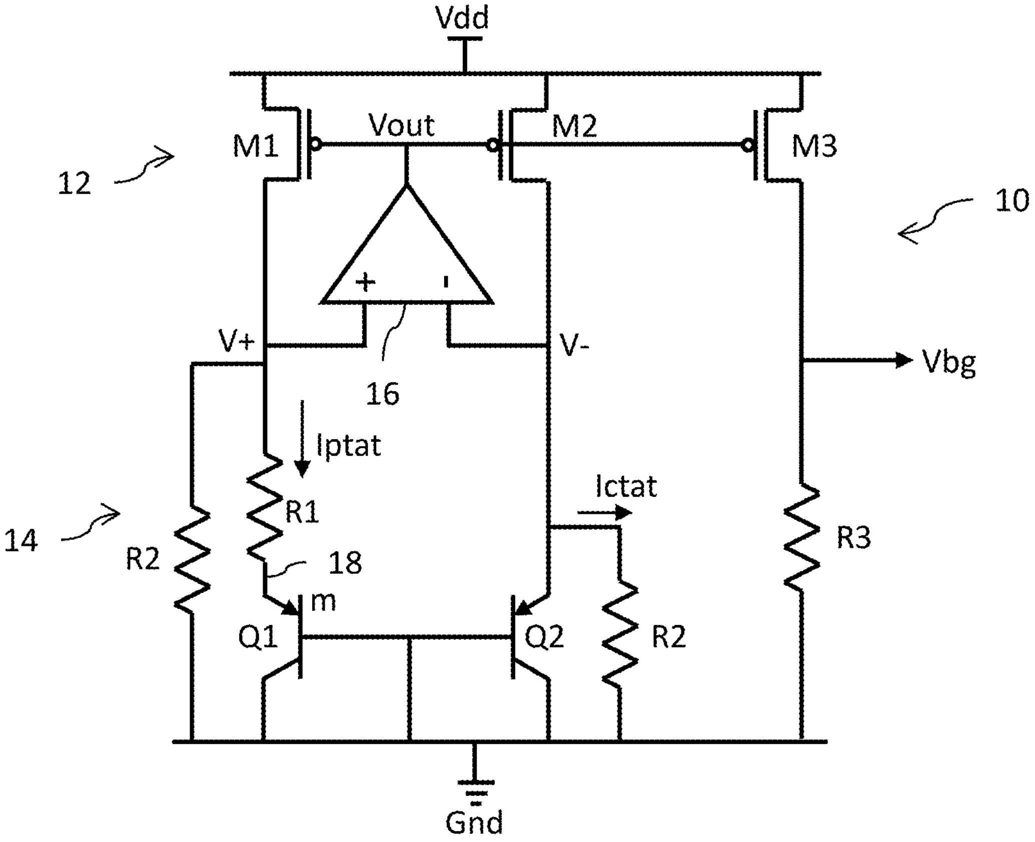
FIG. 1A (Prior Art)
FIGS. 1A and 1B show a circuit diagram for a conventional current-mode bandgap reference voltage generator circuit.
Figure 1B:
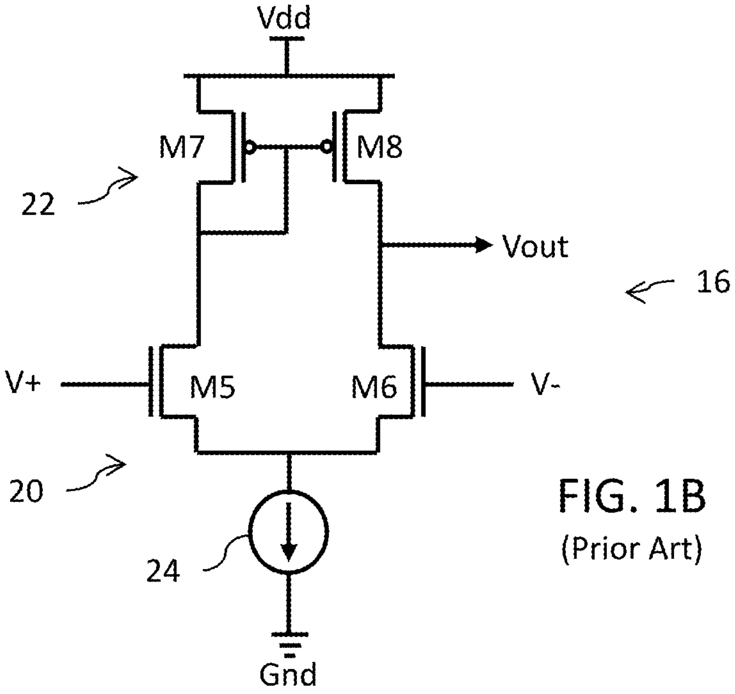
FIG. 1B (Prior Art)

The use of an OTA amplifier 116 formed by bipolar transistor devices, as opposed to the differential amplifier 16 formed by MOSFET devices in FIG. 1B, assists in with addressing the flicker (1/f) noise concern. Flicker noise is also addressed by using bipolar transistors QA, QB and QC in the current mirroring circuit 112, as opposed to MOSFET devices M1, M2 and M3 in FIG. 1A. The main drawback of using bipolar transistors for the differential pair 120 of input transistors Q5, Q6 is their base current Ib. It will be noted that the mirrored current flowing through each of the transistors QA, QB and QC has three components: the PTAT current Iptat across R1, the CTAT current Ictat across R2, and the base current Ib flowing into the bases of the pair of transistors 120. The base current Ib is unwanted and must be addressed by compensation. The effect of this base current Ib is compensated at the output node 134 where the reference voltage Vbg is generated. The compensation current sink circuit 115 operates to sink a compensation current Ib' from the third current flowing through transistor QC, wherein the compensation current Ib' corresponds to (i.e., is equal or substantially equal within the limits of circuit tolerances to) the base current Ib.

The current sink circuit 115 replicates one-half of the differential OTA circuit 116 with a bipolar PNP transistor QD (matching the transistor Q7), an NPN transistor QE (matching the transistor Q5), and a current source 140 (corresponding to the tail current source 124 but with a different current magnitude). The emitter terminal of transistor QD is coupled, preferably connected, to the supply node Vdd. The collector and base terminals of transistor QD are coupled, preferably connected, to each other at intermediate node 142. The transistor QD is connected in diode-configuration. The collector terminal of transistor QE is coupled, preferably connected, to intermediate node 142. The base terminal of transistor QE is coupled, preferably connected, to the output node 134 and is biased by the compensation current Ib' corresponding to the base current Ib at the pair of transistors 120 in amplifier 116. The emitter terminal of transistor QE is coupled, preferably connected, to current source 140 connected to the ground node Gnd. Because the current sink circuit 115 replicates only one-half of the differential OTA circuit 116, the current source 140 sinks a current Is with a magnitude that is one-half the magnitude of the current 2Is sunk by the current source 124.

Since the amplifier 116 is of the OTA-type, it cannot effectively drive a resistive load (i.e., it cannot sink with current Iout a current with a magnitude of 31*b* from the connected bases of the transistors QA, QB and QC) without introducing a significant offset to the amplifier input. To address this issue, the bandgap core circuit 114 further includes a current buffer circuit 130. The output current Iout is buffered by the current buffer circuit 130 to generate the bias current Ibias. The magnitude of the first, second and third mirrored currents at the collectors of transistors QA, QB and QC is a function of the bias current Ibias.

The current buffer circuit 130 comprises a first follower circuit formed by a first transistor T1 having a control terminal coupled, preferably connected, to receive the amplifier output current Iout, a reference terminal coupled, preferably connected, to the ground node Gnd and a follower terminal coupled, preferably connected to receive a first source current Isrc generated by a first current source 151 coupled to the supply node Vdd. The current buffer circuit 130 further comprises a second follower circuit formed by a second transistor T2 having a control terminal coupled, preferably connected, to the follower terminal of the transistor T1, a reference terminal coupled, preferably connected, to the supply node Vdd and a follower terminal coupled, preferably connected, to receive a sink current Isnk generated by a second current source 153 coupled to the ground node Gnd. The bias current Ibias is generated at the follower terminal of the transistor T2.

In a preferred implementation as shown in FIG. 2B, the current buffer circuit 130 is implemented as a source-follower circuit where the first transistor T1 is a p-channel MOSFET device and the second transistor T2 is an n-channel MOSFET device. The drain of transistor T1 is connected to ground and the source of transistor T1 is connected to the first current source 151 and to the gate of transistor T2. The drain of transistor T2 is connected to the supply node Vdd and the source of transistor T2 is connected to the second current source 153 and provides the current Ibias. The implementation illustrated using MOSFET devices for transistors T1, T2 is preferred because there is no current consumption at the gate terminals. It will be noted that any flicker noise introduced by the use of MOSFET devices for transistors T1, T2 is considered to insignificantly contribute to overall noise in the output voltage Vbg and can be ignored.

The use of first and second follower circuits in the current buffer circuit 130 makes it possible to maintain approximately the same voltage at the collector terminals of transistors Q7, Q8 in order to guarantee the linear operation of transistor Q8 in generating the current Iout and thus avoid any early differential effect.

In the implementation which uses the resistor Rshift, the resistance of the resistor Rshift is selected as a function of the mirrored first and second currents (in transistors QA and QB) and the base current Ib so that the voltage drop across the resistor is equal or substantially equal (within design tolerances) to the voltage drop across the current source 124 in the amplifier 116.

Figure 3A:
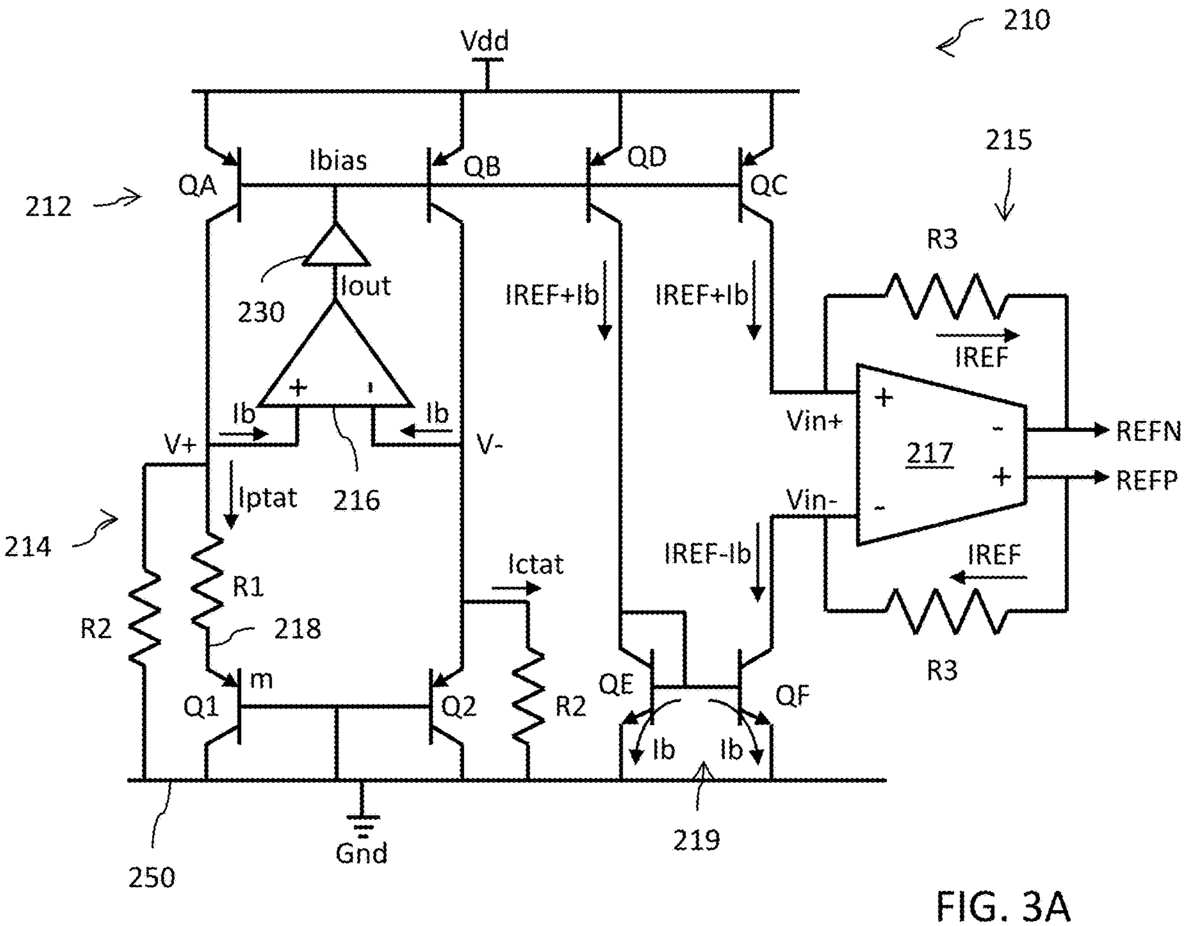
FIGS. 3A, 3B and 3C show a circuit diagram for a flicker noise free differential voltage reference generator circuit.
Figure 3B:
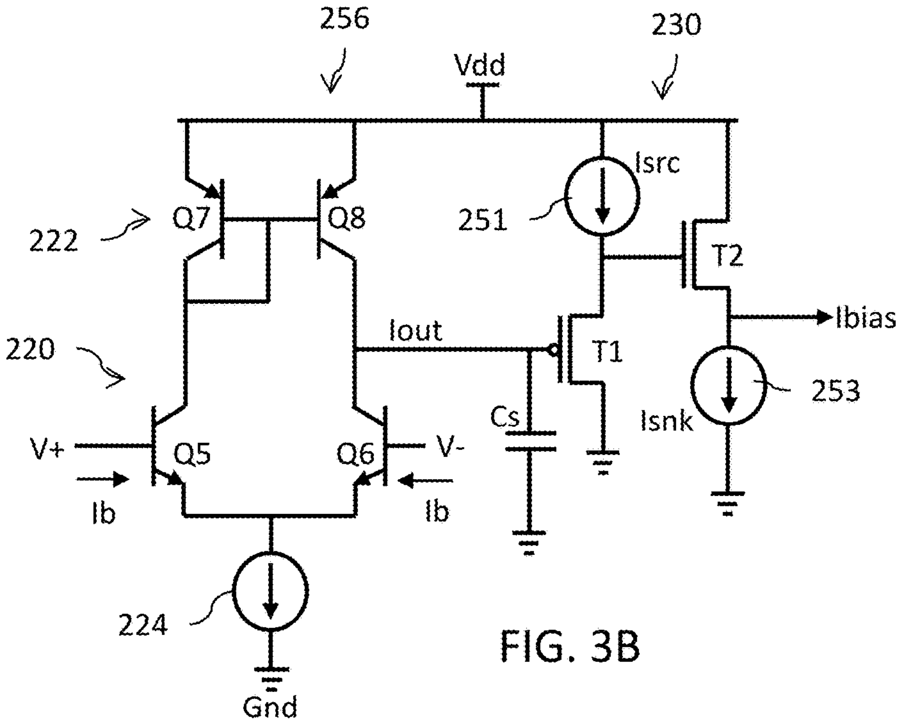
Figure 3C:
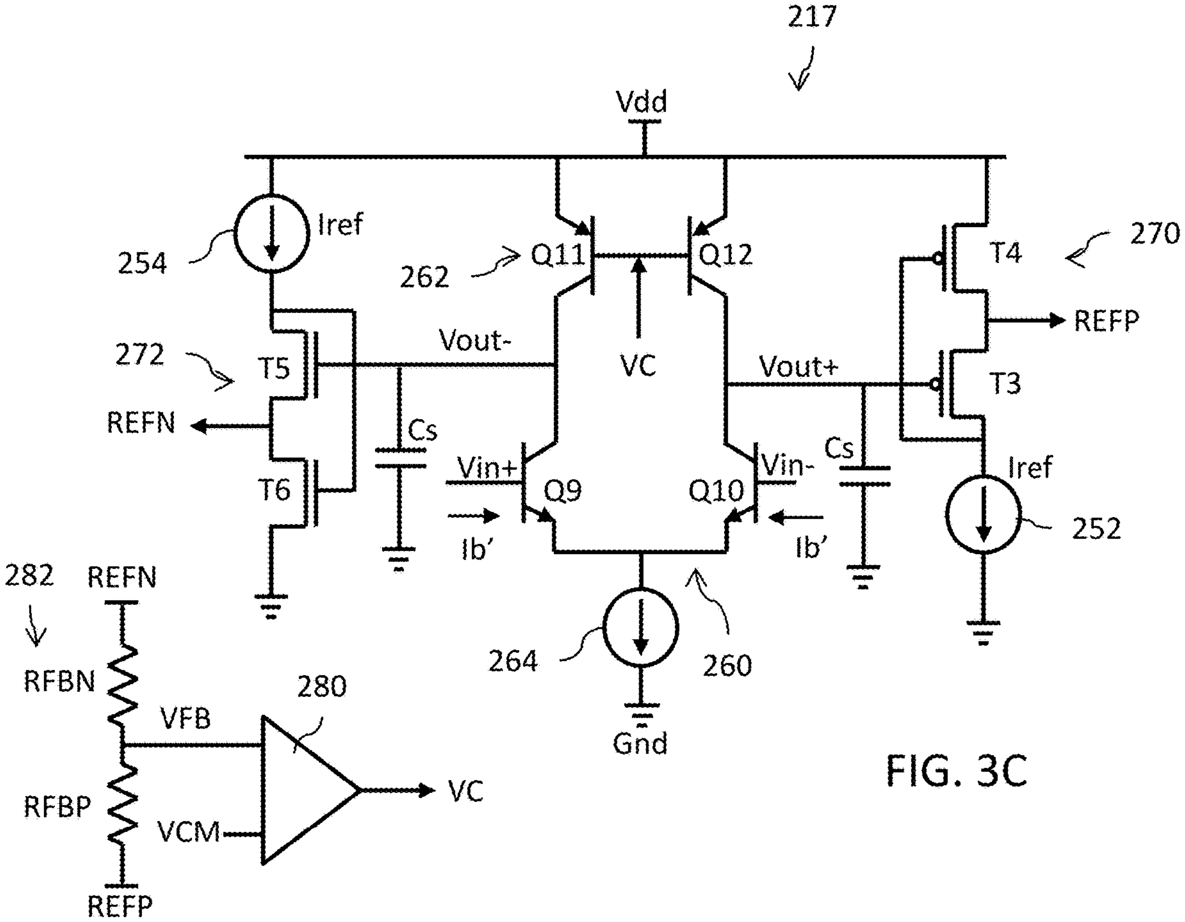

Reference is now made to FIGS. 3A, 3B and 3C which show a circuit diagram for a flicker noise free differential voltage reference generator circuit 210. The circuit 210 includes a current mirror circuit 212, 219, a bandgap core circuit 214 and a transresistance amplifier circuit 215 with a compensation current sinking functionality.

The current mirror circuit 212 is formed by PNP bipolar transistors QA, QB, QC and QD as well as NPN bipolar transistors QE and QF. The emitter terminals of transistors QA, QB, QC and QD are coupled, preferably connected, to the supply node Vdd. The base terminals of transistors QA, QB, QC and QD are coupled, preferably connected, to each other and biased by a bias current Ibias to generate mirrored currents. The collector terminal of transistor QA outputs a first mirrored current, the collector terminal of transistor QB outputs a second mirrored current, the collector terminal of transistor QC outputs a third mirrored current and the collector terminal of transistor QD outputs a fourth mirrored current. The third mirrored current output from the collector terminal of transistor QC is applied (perhaps through a series-connected input resistor—not explicitly shown) to the non-inverting (+) input of a fully differential amplifier 217 of the transresistance amplifier circuit 215. The fourth mirrored current output from the collector terminal of transistor QD is mirrored by transistors QE and QF of circuit 219 and applied (perhaps through a series-connected input resistor—not explicitly shown) to the inverting (−) input of the fully differential amplifier 217.

The transresistance amplifier circuit 215 further includes a first feedback resistor R3 having a first terminal coupled, preferably connected, to the non-inverting input of the fully differential amplifier 217 and a second terminal coupled, preferably connected, to the inverting output of the fully differential amplifier 217. A second feedback resistor R3 has a first terminal coupled, preferably connected, to the inverting input of the fully differential amplifier 217 and a second terminal coupled, preferably connected, to the non-inverting output of the fully differential amplifier 217.

The emitter terminals of transistors QE and QF of mirror circuit 219 are coupled, preferably connected, to a reference voltage (for example, ground) node 250, and the collector terminal of transistor QE is coupled, preferably connected, to the collector terminal of transistor QD, the collector terminal of transistor QF is coupled, preferably connected, to the inverting input of fully differential amplifier 217, and the base terminals of transistors QE and QF are coupled, preferably connected, to each other and to the collector of transistor QE.

The bandgap core circuit 214 includes a differential operational transconductance amplifier (OTA) circuit 216 configured in a current control feedback loop that generates an output current Iout which controls generation of the mirrored currents by the transistors QA, QB, QC and QD. The non-inverting (+) input of the differential OTA circuit 216 receives a voltage V+ at the collector of the transistor QA and the inverting (−) input of the differential OTA circuit 216 receives a voltage V− at the collector of the transistor QB. The bandgap core circuit 214 further includes PNP bipolar transistors Q1 and Q2. The collector terminals of transistors Q1 and Q2 are coupled, preferably connected, to the reference voltage (ground) node 250. The base terminals of transistors Q1 and Q2 are coupled, preferably connected, to each other and to the ground node 250. The transistors Q1 and Q2 of the bandgap core circuit 214 are thus each connected in diode-configuration. The emitter terminal of transistor Q1 is coupled, preferably connected, to an intermediate node 218. The emitter terminal of transistor Q2 is coupled, preferably connected, to the collector of transistor QB at the inverting (−) input of the differential OTA circuit 216. A resistor R1 has a first terminal coupled, preferably connected, to the intermediate node 218 and a second terminal coupled, preferably connected, to the collector of transistor QA at the non-inverting (+) input of the differential OTA circuit 216. A first resistor R2 has a first terminal coupled, preferably connected, to the collector of transistor QA at the non-inverting (+) input of the differential OTA circuit 216 and a second terminal coupled, preferably connected, to the ground node 250. A second resistor R2 has a first terminal coupled, preferably connected, to the emitter of transistor Q2 at the inverting (−) input of the differential OTA circuit 216 and a second terminal coupled, preferably connected, to the ground node 250.

The differential OTA circuit 216 includes a differential pair 220 of input transistors Q5, Q6 coupled to a current mirror load circuit 222 formed by transistors Q7, Q8. The input transistors Q5, Q6 are NPN bipolar transistors. The load transistors Q7, Q8 are PNP bipolar transistors. The common emitter terminals of the transistors Q5 and Q6 are coupled, preferably connected, to a tail current source 224 connected to the ground node Gnd. The base terminal of input transistor Q5 (at the non-inverting (+) input) receives the voltage V+ at collector of the transistor QA (as well as a base current Ib) and the base terminal of the input transistor Q6 (at the inverting (−) input) receives the voltage V− at collector of the transistor QB (as well as a base current Ib). The collector terminal of input transistor Q5 is coupled, preferably connected, to the collector and base terminals of the load transistor Q7. The collector terminal of input transistor Q6 is coupled, preferably connected, to the collector terminal of the load transistor Q8 at the output of the amplifier. The base terminals of the transistors Q7, Q8 are coupled, preferably connected, to each other. The transistor Q7 is connected in diode-configuration. The output current Iout of the differential OTA circuit 216 generated at the common collector terminals of transistors Q6 and Q8 is a function of the difference between the voltages V+ and V−. A stabilization capacitor Cs has a first terminal coupled, preferably connected, to the common collector terminals of transistors Q6 and Q8 and a second terminal coupled, preferably connected, to the ground node Gnd.

The bandgap core circuit 214 further includes a current buffer circuit 230. The output current Iout is buffered by the current buffer circuit 230 to generate the bias current Ibias. The magnitude of the first, second, third and fourth mirrored currents at the collectors of transistors QA, QB, QC and QD is a function of the bias current Ibias.

The current buffer circuit 230 comprises a first follower circuit formed by a first transistor T1 having a control terminal coupled, preferably connected, to receive the amplifier output current Iout, a reference terminal coupled, preferably connected, to the ground node Gnd and a follower terminal coupled, preferably connected, to receive a first source current Isrc generated by a first current source 251 coupled to the supply node Vdd. The current buffer circuit 230 further comprises a second follower circuit formed by a second transistor T2 having a control terminal coupled, preferably connected, to the follower terminal of the transistor T1, a reference terminal coupled, preferably connected, to the supply node Vdd and a follower terminal coupled, preferably connected, to receive a sink current Isnk generated by a second current source 253 coupled to the ground node Gnd. The bias current Ibias is generated at the follower terminal of the transistor T2.

In a preferred implementation as shown in FIG. 3B, the current buffer circuit 230 is implemented as a source-follower circuit where the first transistor T1 is a p-channel MOSFET device and the second transistor T2 is an n-channel MOSFET device. The drain of transistor T1 is connected to ground and the source of transistor T1 is connected to the first current source 251 and to the gate of transistor T2. The drain of transistor T2 is connected to the supply node Vdd and the source of transistor T2 is connected to the second current source 253 and provides the current Ibias. The implementation illustrated using MOSFET devices for transistors T1, T2 is preferred because there is no current consumption at the gate terminals. It will be noted that any flicker noise introduced by the use of MOSFET devices for transistors T1, T2 is considered to insignificantly contribute to overall noise in the output voltage Vbg and can be ignored.

The use of first and second follower circuits in the current buffer circuit 230 makes it possible to maintain approximately the same voltage at the collector terminals of transistors Q7, Q8 in order to guarantee the linear operation of transistor Q8 in generating the current Iout and thus avoid any early differential effect.

The fully differential amplifier circuit 217 includes an input stage formed by a differential pair 260 of input transistors Q9, Q10 coupled to a current mirror load circuit 262 formed by transistors Q11, Q12. The input transistors Q9, Q10 are NPN bipolar transistors. The load transistors Q11, Q12 are PNP bipolar transistors. The common emitter terminals of the transistors Q9 and Q10 are coupled, preferably connected, to a tail current source 264 connected to the ground node Gnd. The transistors Q9, Q10 and tail current source 264 are configured to respectively match the transistors Q5, Q6 and tail current source 224 (i.e., replica transistor devices and same current magnitudes for the current sources).

The base terminal of input transistor Q9 (at the non-inverting (+) input) receives the voltage Vin+ at the collector of the transistor QC (as well as a base current Ib') and the base terminal of the input transistor Q9 (at the inverting (−) input) receives the voltage Vin− at the collector of the transistor QE (as well as a base current Ib'). The collector terminal of input transistor Q9 is coupled, preferably connected, to the collector and base terminals of the load transistor Q11. The collector terminal of input transistor Q10 is coupled, preferably connected, to the collector terminal of the load transistor Q12 at the output of the amplifier. The base terminals of the transistors Q11, Q12 are coupled, preferably connected, to each other and receive a bias control voltage VC.

The positive output voltage Vout+ generated at the common collector terminals of transistors Q10 and Q12 is a function of the difference between the voltages V+ and V− and is applied to an input of an output stage including a first flip voltage follower circuit 270. The first flip voltage follower circuit 270 includes a transistor T3 coupled, preferably connected, in series with a transistor T4. Transistors T3 and T4 are both p-channel MOSFET devices. The positive output voltage Vout+, stabilized by a capacitor Cs, is applied to the gate terminal of transistor T3. The source of transistor T4 is coupled, preferably connected, to the supply node Vdd. The drain of transistor T4 is coupled, preferably connected, to the source of transistor T3 at the non-inverting output of amplifier 217 where the positive differential output reference voltage REFP is generated. The gate of transistor T4 is coupled, preferably connected, to the drain of transistor T3. The drain of transistor T3 is further connected to a current source 252 configured to generate a bias current sunk from transistor T3 to the ground node.

The negative output voltage Vout-generated at the common collector terminals of transistors Q9 and Q11 is a function of the difference between the voltages V+ and V− and is applied to an input of the output stage including a second flip voltage follower circuit 272. The second flip voltage follower circuit 272 includes a transistor T5 coupled, preferably connected, in series with a transistor T6. Transistors T5 and T6 are both n-channel MOSFET devices. The negative output voltage Vout-, stabilized by a capacitor Cs, is applied to the gate terminal of transistor T5. The source of transistor T6 is coupled, preferably connected, to the ground node. The drain of transistor T6 is coupled, preferably connected, to the source of transistor T5 at the inverting output of amplifier 217 where the negative differential output reference voltage REFN is generated. The gate of transistor T6 is coupled, preferably connected, to the drain of transistor T5. The drain of transistor T5 is further connected to a current source 254 configured to generate a bias current sourced to transistor T5 from the supply node Vdd.

The transistors T3 and T5 of the circuits 270 and 272 are operating in source follower configuration.

Discharged capacitors are applied at each clock cycle on the REFP node (often close to the supply voltage). When REFP drops, the gate to source voltage (Vgs) of transistor T3 is reduced accordingly. The current flowing in the source-drain path of transistor T3 is then less than the current Iref (sunk by current source 252). Therefore, the gate voltage of transistor T4 rapidly decreases, resulting in a high current through this transistor, recharging the capacitors connected to the REFP node.

Charged capacitors are applied at each clock cycle to the REFN node (often close to ground). When the REFN suddenly increases, the Vgs voltage of transistor T5 is reduced accordingly. The current flowing in the source-drain path of transistor T5 is then less than the current Iref (sourced by current source 254). Therefore, the gate voltage of transistor T6 increases rapidly, resulting in a high current through this transistor, discharging the capacitors connected to the REFN node.

An advantage of using the circuits 270 and 272 in the output stage of the amplifier 217 is to lower the output impedance of the amplifier circuit 217. The use of flip voltage follower circuits 270 and 272 in the output stage is also superior to the use of a conventional MS transistor-based voltage follower circuit because the sourcing and sinking current at the output nodes is not limited by the current sources.

The bias control voltage VC applied at the connected base terminals of transistors Q11 and Q12 is output from a differential amplifier 280, for example comprising an operational amplifier (OP-AMP). A first input of the differential amplifier 280 receives a common mode reference voltage VCM. This voltage VCM may be generated by a suitable generator circuit at a voltage level half-way between Vdd and ground. A second input of the differential amplifier 280 receives a feedback voltage VFB generated by a resistive divider circuit 282 formed by a first feedback resistor RFBN and second feedback resistor RFBP connected in series with each other at a tap node. The first feedback resistor RFBN is coupled, preferably connected, between the inverting output of amplifier 217 (where the negative differential output reference voltage REFN is generated) and the tap node. The second feedback resistor RFBP is coupled, preferably connected, between the non-inverting output of amplifier 217 (where the positive differential output reference voltage REFP is generated) and the tap node. The bias control voltage VC is generated at a level which causes the output voltages Vout+ and Vout− as applied to the output stage flip voltage follower circuits 270, 272 to generate the differential output voltages REFP and REFN at levels where their median voltage equals the common mode voltage level.

The main drawback of using bipolar transistors for the differential pair 220 of input transistors Q5, Q6 in circuit 220 is their base current Ib. It will be noted that the mirrored current flowing through each of the transistors QA, QB, QC and QD has three components: the PTAT current Iptat across R1, the CTAT current Ictat across R2 (wherein IREF=Iptat+Ictat), and the base current Ib flowing into the bases of the pair of transistors 220. The base current Ib is unwanted and must be addressed by compensation. The effect of this base current Ib is compensated at the differential input of the amplifier 217 by sinking, at each input, a compensation current Ib' from the applied input currents IREF+Ib and IREF-Ib, wherein the compensation current Ib' corresponds to (i.e., is equal or substantially equal within the limits of circuit tolerances to) the base current Ib.

The third mirrored current output from the collector terminal of transistor QC is composed of the constant (across process, voltage and temperature (PVT)) current IREF and an undesired current Ib corresponding to the base current Ib of the differential input transistors Q5 and Q6. The current IREF+Ib is applied to (i.e., sourced to) the non-inverting (+) input of the fully differential amplifier 217 where the input transistor Q9 (matching transistor Q5) sinks a base current Ib' for compensation. The current flowing through the first feedback resistor R3 (coupled, preferably connected, between the non-inverting input of the fully differential amplifier 217 and the inverting output of the fully differential amplifier 217) is the current IREF=(IREF+Ib)−Ib', where Ib' is equal or substantially equal to Ib.

Likewise, the fourth mirrored current output from the collector terminal of transistor QD is composed of the constant (across process, voltage and temperature (PVT)) current IREF and an undesired current Ib corresponding to the base current Ib of the differential input transistors Q5 and Q6. The current IREF+Ib is mirrored by the mirror 256 to generate the current IREF-Ib which is applied to (i.e., sunk from) the inverting (−) input of the fully differential amplifier 217 where the input transistor Q10 (matching transistor Q6) sinks a base current Ib' for compensation. The current flowing through the second feedback resistor R3 (coupled, preferably connected, between the inverting input of the fully differential amplifier 217 and the non-inverting output of the fully differential amplifier 217) is the current IREF=(IREF−Ib)+Ib', where Ib' is equal or substantially equal to Ib. Note here that because mirror circuit 219 uses bipolar transistors QE and QF, a base current Ib is sunk by each transistor QE and QF so that the output current of the mirror is (IREF+Ib)−(2*Ib)=IREF−Ib. In this configuration, the bipolar transistors QE and QF of the mirror circuit 219 are designed to match differential input transistors Q5 and Q6 and differential input transistors Q9 and Q10.

Although FIG. 3A does not show the use of a virtual ground and the resistor Rshift, it will be understood that the bandgap circuit of FIG. 3A could be implemented in a manner like the bandgap circuit of FIG. 2A to include a virtual ground.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A voltage generator reference circuit, comprising:

a bandgap voltage generator circuit including a current mirror and a transconductance amplifier circuit in a current control feedback loop having a differential input which receives a bipolar transistor base current, wherein the bandgap voltage generator circuit includes a first output node generating a first current comprising a bandgap reference current plus the bipolar transistor base current and a second output node generating a second current comprising the bandgap reference current minus the bipolar transistor base current;

wherein transistors used in the current mirror and at the differential input of the transconductance amplifier are only bipolar transistors; and a transresistance amplifier circuit comprising:

a differential amplification circuit having a non-inverting input configured to receive the first current, an inverting input configured to receive the second current, a non-inverting output and an inverting output;

a first feedback resistor coupled between the non-inverting input and the inverting output;

a second feedback resistor coupled between the inverting input and the non-inverting output; and a compensation current sink circuit configured to sink a first compensation current from the non-inverting input corresponding to the base current and configured to sink a second compensation current from the inverting input corresponding to the base current.

2. The voltage generator reference circuit of claim 1:

wherein the transconductance amplifier circuit comprises a first bipolar transistor with a base terminal coupled to a non-inverting transconductance amplifier input receiving the base current and a second bipolar transistor with a base terminal coupled to an inverting transconductance amplifier input receiving the base current; and wherein the compensation current sink circuit comprises a third bipolar transistor with a base terminal coupled to the non-inverting input of the differential amplification circuit and configured to receive the first compensation current and a fourth bipolar transistor with a base terminal coupled to the inverting input of the differential amplification circuit and configured to receive the second compensation current.

3. The voltage generator reference circuit of claim 2, wherein the first and third bipolar transistors are matching transistors.

4. The voltage generator reference circuit of claim 2, wherein the second and fourth bipolar transistors are matching transistors.

5. The voltage generator reference circuit of claim 2:

wherein the transconductance amplifier circuit further comprises a first tail current source coupled to the first and second bipolar transistors; and wherein the compensation current sink circuit further comprises a second current source coupled to the third and fourth bipolar transistors.

6. The voltage generator reference circuit of claim 1, further comprising a current buffer circuit configured to buffer an output current of the transconductance amplifier circuit to generate a bias current for the current control feedback loop.

7. The voltage generator reference circuit of claim 6, wherein the current buffer circuit comprises:

a first follower circuit having an input coupled to receive the output current of the transconductance amplifier circuit; and a second follower circuit having an input coupled to receive an output of the first follower circuit and an output configured to generate the bias current.

8. The voltage generator reference circuit of claim 7, wherein the first follower circuit comprises a first follower transistor coupled to a first current source at the output of the first follower circuit, wherein a control terminal of the first follower transistor is configured to receive the output current of the transconductance amplifier circuit, and wherein the second follower circuit comprises a second follower transistor coupled to a second current source at the output of the second follower circuit, wherein a control terminal of the second follower transistor is coupled to the output of the first follower circuit.

9. The voltage generator reference circuit of claim 8, wherein the first current source is configured to source current to the first follower transistor and wherein the second current source is configured to sink current from the second follower transistor.

10. The voltage generator reference circuit of claim 1, wherein the current mirror circuit is configured to generate the second current derived from the first current, said current mirror circuit comprising first and second bipolar mirror transistors.

11. The voltage generator reference circuit of claim 10, wherein the first and second bipolar mirror transistors match the first and second bipolar transistors of the transconductance amplifier circuit.

12. The voltage generator reference circuit of claim 1, wherein the differential amplification circuit comprises:

a differential amplifier stage coupled to the non-inverting input and the inverting input of the differential amplification circuit;

a first flip voltage follower circuit having an input coupled to a first output of the differential amplifier stage and an output coupled to the non-inverting output of the differential amplification circuit; and a second flip voltage follower circuit having an input coupled to a second output of the differential amplifier stage and an output coupled to the inverting output of the differential amplification circuit.

13. The voltage generator reference circuit of claim 12, wherein the first flip voltage follower circuit comprises p-channel MOS transistors coupled in series at the non-inverting output of the differential amplification circuit and the second flip voltage follower circuit comprises n-channel MOS transistors coupled in series at the inverting output of the differential amplification circuit.

14. The voltage generator reference circuit of claim 13, further comprising:

a first current source configured to sink a bias current from the series coupled p-channel MOS transistors; and a second current source configured to source a bias current to the series coupled n-channel MOS transistors.

15. A voltage generator reference circuit, comprising:

a first current mirroring circuit including a first bipolar transistor, a second bipolar transistor, a third bipolar transistor and a fourth bipolar transistor, wherein a first current is output by the third bipolar transistor and a second current is output by the fourth bipolar transistor;

a second current mirroring circuit configured to mirror the second current and generate a third current;

a bandgap core circuit including:

a fifth bipolar transistor and sixth bipolar transistor coupled, respectively, to the first and second bipolar transistors and configured to use a difference in base to emitter voltages of the fifth and sixth bipolar transistors to generate a complementary to absolute temperature (CTAT) voltage and a proportional to absolute temperature (PTAT) voltage from currents output by the first and second bipolar transistors; and a transconductance amplification circuit having a differential input comprising seventh and eighth bipolar transistors coupled, respectively, to the first and second bipolar transistors, the seventh bipolar transistor having a base configured to receive a first base current and the eighth bipolar transistor having a base configured to receive a second base current, and an output coupled to apply a bias current to base terminals of the first, second, third and fourth bipolar transistors; and a differential amplification circuit having a non-inverting input configured to receive the first current, an inverting input configured to receive the third current, a ninth bipolar transistor having a base coupled to the non-inverting input and configured to sink a first compensation current corresponding to the first base current and a tenth bipolar transistor having a base coupled to the inverting input and configured to sink a second compensation current corresponding to the second base current.

16. The voltage generator reference circuit of claim 15, wherein the seventh and ninth bipolar transistors are matching transistors.

17. The voltage generator reference circuit of claim 15, wherein the eighth and tenth bipolar transistors are matching transistors.

18. The voltage reference generator circuit of claim 15, wherein the transconductance amplification circuit comprises a transconductance amplifier and a current buffer, wherein the current buffer is configured to buffer an output current of the transconductance amplifier to generate the bias current applied to base terminals of the first, second, third and fourth bipolar transistors.

19. The voltage generator reference circuit of claim 18, wherein the current buffer comprises:

a first follower circuit having an input coupled to receive the output current of the transconductance amplifier; and a second follower circuit having an input coupled to receive an output of the first follower circuit and an output configured to generate the bias current.

20. The voltage generator reference circuit of claim 19, wherein the first follower circuit comprises a first follower transistor coupled to a first current source at the output first follower circuit, wherein a control terminal of the first follower transistor is configured to receive the output current of the transconductance amplifier, and wherein the second follower circuit comprises a second follower transistor coupled to a second current source at the output of the second follower circuit, wherein a control terminal of the second follower transistor is coupled to the output of the first follower circuit.

21. The voltage reference generator circuit of claim 20, wherein the first current source is configured to source current to the first follower transistor and wherein the second current source is configured to sink current from the second follower transistor.

22. The voltage reference generator circuit of claim 15, further comprising:

a first flip voltage follower circuit having an input coupled to a first output of the differential amplification circuit and an output coupled to a non-inverting voltage output node; and a second flip voltage follower circuit having an input coupled to a second output of the differential amplification circuit and an output coupled to an inverting voltage output node.

23. The voltage reference generator circuit of claim 22, further comprising:

a first feedback resistor coupled between the non-inverting input of the differential amplification circuit and the inverting voltage output node; and a second feedback resistor coupled between the inverting input of the differential amplification circuit and the non-inverting voltage output node.

* * * * *